US012620746B2

(12) United States Patent
Yamaguchi et al.

(10) Patent No.: US 12,620,746 B2
(45) Date of Patent: May 5, 2026

(54) CONNECTOR WITH ELASTIC HEAT STORAGE MEMBER ABUTTING ELECTRIC WIRE CONNECTION PART

(71) Applicant: YAZAKI CORPORATION, Tokyo (JP)

(72) Inventors: Yasuhiro Yamaguchi, Kakegawa (JP); Hideki Mizuno, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 451 days.

(21) Appl. No.: 18/501,962

(22) Filed: Nov. 3, 2023

(65) Prior Publication Data

US 2024/0154350 A1 May 9, 2024

(30) Foreign Application Priority Data

Nov. 9, 2022 (JP) ................................. 2022-179292

(51) Int. Cl.
| | |
|---|---|
| *H01R 13/46* | (2006.01) |
| *B60L 53/16* | (2019.01) |
| *H01R 13/52* | (2006.01) |
| *H05K 7/20* | (2006.01) |

(52) U.S. Cl.
CPC .............. *H01R 13/46* (2013.01); *B60L 53/16* (2019.02); *H01R 13/521* (2013.01); *H05K 7/2039* (2013.01); *H01R 2201/26* (2013.01)

(58) Field of Classification Search
CPC .. H01R 13/46; H01R 13/521; H01R 2201/26; H01R 13/533; H01R 13/02; B60L 53/16; H05K 7/2039
See application file for complete search history.

(56) References Cited

U.S. PATENT DOCUMENTS

2012/0258617 A1 10/2012 Osawa

FOREIGN PATENT DOCUMENTS

| | | | |
|---|---|---|---|
| JP | 2012-221612 A | 11/2012 | |
| JP | 2024082071 A * | 6/2024 | ......... H01R 13/5205 |
| JP | 2025147811 A * | 10/2025 | |

* cited by examiner

*Primary Examiner* — Travis S Chambers
(74) *Attorney, Agent, or Firm* — KENEALY VAIDYA LLP

(57) ABSTRACT

A connector includes a terminal including an electric wire connection part electrically connected to a conductive electric wire and an electrical connection part that can be electrically connected to a connection counterpart member; a housing that accommodates and holds the terminal therein; and a heat storage member that is formed in a cylindrical shape by a conductive metal material, that accommodates the electric wire connection part therein, and that covers an outer surface of the electric wire connection part. The heat storage member includes a plurality of inner fins that protrude from an inner surface side and that are disposed while being brought into contact with the outer surface of the electric wire connection part.

8 Claims, 8 Drawing Sheets

T2   C1   C2   1A 212 (200)

510 (500A)

W 530 (500A)

520 (500A)

CONNECTOR WITH ELASTIC HEAT STORAGE MEMBER ABUTTING ELECTRIC WIRE CONNECTION PART

CROSS-REFERENCE TO RELATED APPLICATION(S)

The present application claims priority to and incorporates by reference the entire contents of Japanese Patent Application No. 2022-179292 filed in Japan on Nov. 9, 2022.

BACKGROUND OF THE INVENTION

1. Field of the Invention

The present invention relates to a connector.

2. Description of the Related Art

For example, Japanese Patent Application Laid-open No. 2012-221612 discloses a connector including a plurality of terminals and a housing having a terminal housing part that accommodates and holds the terminals.

Incidentally, a charging connector such as the connector disclosed in Japanese Patent Application Laid-open No. 2012-221612 described above is expected to respond to a large current, to correspond to an increase in the battery capacity and a reduction in the charging time. In this case, when a large current flows between the connectors, the amount of heat generated from a place with high resistance such as an electrical connection part in which the terminals are connected to each other, and an electric wire connection part in which the terminal and the electric wire are connected may be increased, and the heat may be accumulated in a heat generation source. Consequently, a rapid temperature increase may occur in the connector. Thus, to respond to a large current, there is a need to prevent a rapid temperature increase in the connector, by increasing the diameter of the electric wire or by additionally providing a cooling device. As a result, there is room for improvement in terms of a possible increase in the size of the connector.

SUMMARY OF THE INVENTION

The present invention has been made in view of the above circumstances, and an object of the present invention is to provide a connector that can prevent an increase in size while satisfying the temperature requirements.

In order to achieve the above mentioned object, a connector according to one aspect of the present invention includes a terminal that includes an electric wire connection part electrically connected to a conductive electric wire and an electrical connection part that is able to be electrically connected to a connection counterpart member; a housing that accommodates and holds the terminal therein; and a heat storage member that is formed in a cylindrical shape by a conductive metal material, that accommodates the electric wire connection part therein, and that covers an outer surface of the electric wire connection part, wherein the heat storage member includes a plurality of inner fins that protrude from an inner surface side and that are disposed while being brought into contact with the outer surface of the electric wire connection part.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the accompanying drawings. However, the present invention is not limited to this embodiment. Moreover, the components in the following embodiment include those that can be easily replaced by those skilled in the art, or those substantially the same.

EMBODIMENT

For example, a connector 1 according to the present embodiment is installed in a vehicle in which a battery is mounted such as an electric vehicle (EV) and a hybrid electric vehicle (HEV). The connector 1 is a connection mechanism that can charge the battery, by being attached to a vehicle body, and by being electrically connected to a power source outside the vehicle via a vehicle side opening part. The connector 1 forms what is called a charging inlet. The connection portion of the connector 1 can be exposed to the outside of a vehicle, by attaching an openable/closable lid (not illustrated) thereto and by opening the lid.

Figure 1:
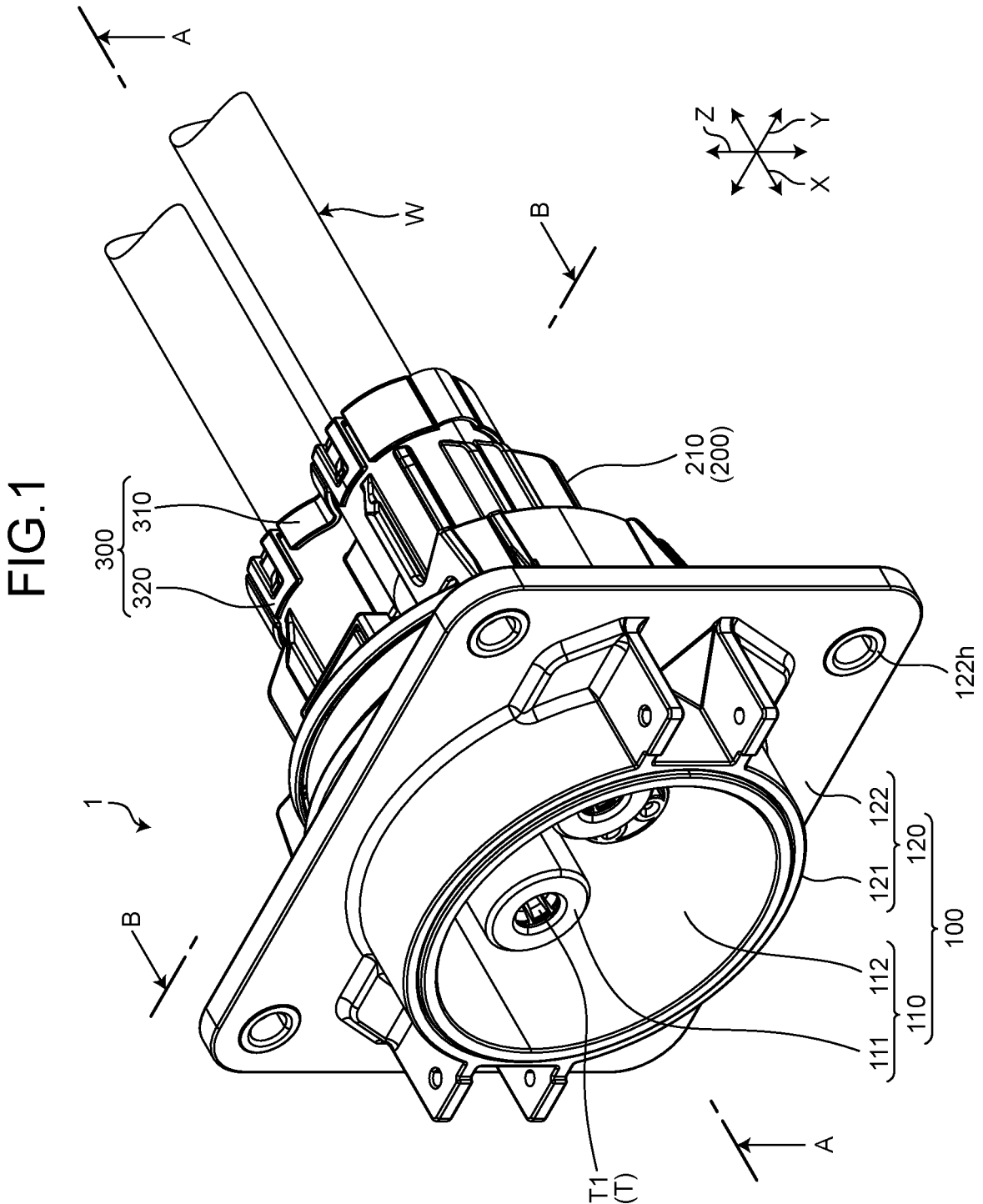
FIG. 1 is a perspective view illustrating a schematic configuration of a connector according to an embodiment.
Figure 2:
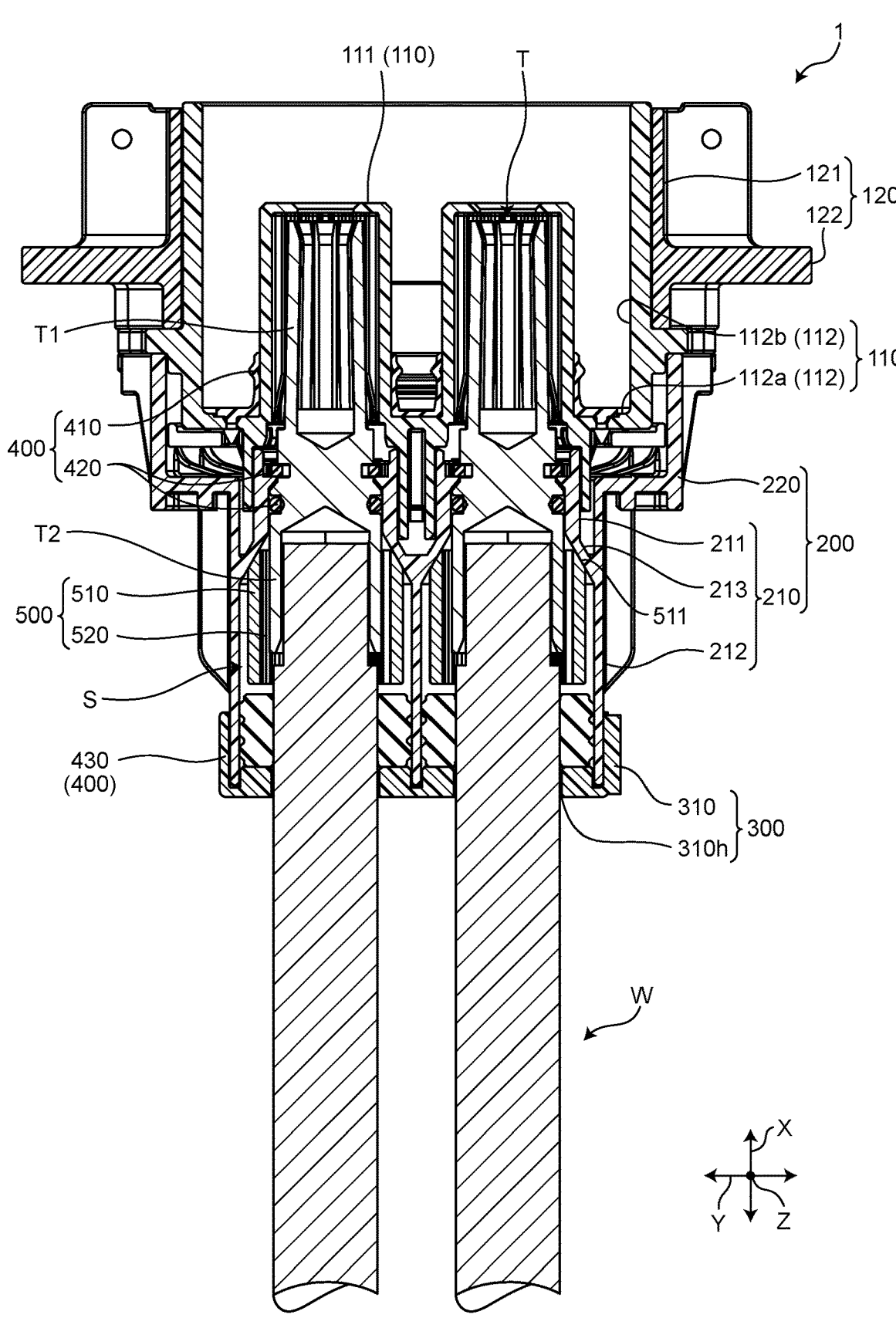
FIG. 2 is a sectional view cut along line A-A in FIG. 1.
Figure 3:
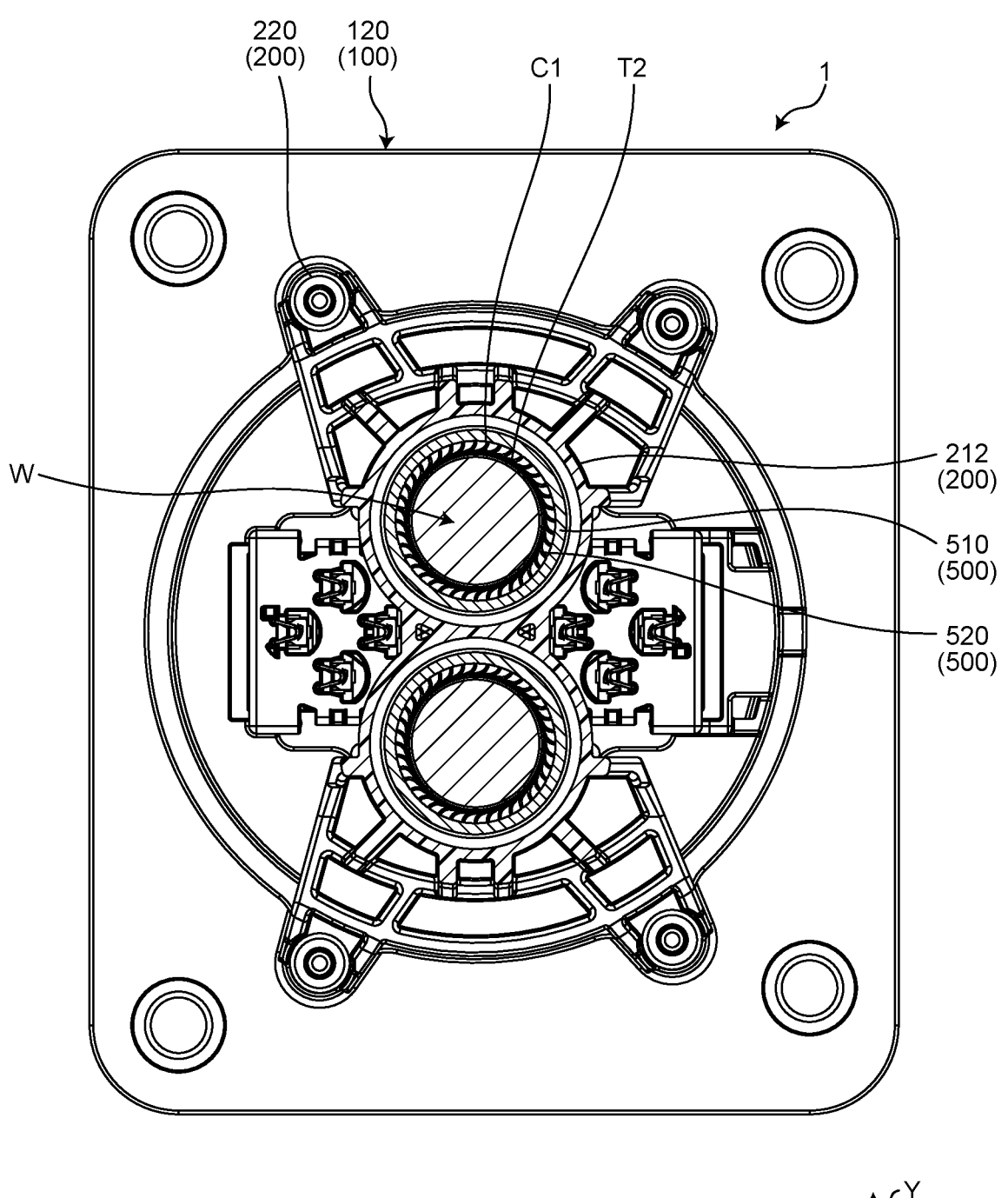
FIG. 3 is a sectional view cut along line B-B in FIG. 1.

The connector 1 includes a terminal T provided on a terminal end of an electric wire W, a housing 100 that holds the terminal T, a terminal holder 200 assembled to an end part of the housing 100, a rear holder 300 assembled to an end part of the terminal holder 200, a water sealing member 400, and a heat storage member 500 (see FIG. 1 to FIG. 3). Then, as a structure that can absorb heat generated from a heat generation source when a large current flows, by providing the heat storage member 500 in contact with the outer surface of the heat generation source, the connector 1 of the present embodiment can prevent an increase in size while preventing heat from accumulating in the heat generation source. Hereinafter, with reference to FIG. 1 to FIG. 5, each configuration of the connector 1 will be described in detail.

In the following description, out of a first direction, a second direction, and a third direction intersecting each other, the first direction is referred to as an "axial direction X", the second direction is referred to as a "width direction Y", and the third direction is referred to as a "height direction Z". The axial direction X, the width direction Y, and the height direction Z are orthogonal to each other. The axial direction X typically corresponds to the extending direction of the electric wire W or the like that is accommodated in and held by the housing 100. Unless otherwise specified, the directions used in the following description indicate directions in a state where the connector 1 is assembled.

Moreover, the tip end side in the axial direction X typically corresponds to a counterpart connector or the like on the power source side in a state where the connector 1 is fitted to the counterpart connector. The base end side in the axial direction X typically corresponds to the connector 1 side or the like in a state where the connector 1 is fitted to the counterpart connector.

The terminal T is formed of a metal material such as conductive copper, and is electrically connected to the counterpart terminal when the connector 1 is fitted to the counterpart connector. As illustrated in FIG. 2, the terminal T includes an electrical connection part T1 and an electric wire connection part T2. The electrical connection part T1 is located on the tip end side in the axial direction X, and can be connected to the counterpart terminal when the connector 1 is fitted to the counterpart connector. Moreover, the electric wire connection part T2 is located on the base end side in the axial direction X, and can connect the terminal end of the electric wire W. The shape of the electric wire connection part T2 is not limited to a substantially circular shape as illustrated in FIG. 2. The electric wire connection part T2 may be connected to a conductor portion of the electric wire W, by being caulked and crimped to a core wire that is the conductor portion. The electric wire connection part T2 may also be connected to the conductor portion using a method such as welding. Therefore, the shape of the electric wire connection part T2 may be a substantially circular shape as illustrated in FIG. 3, or may be other shapes such as a polygon.

The housing 100 is formed of an insulating synthetic resin material, and accommodates and holds the terminal T therein. As illustrated in FIG. 1 and FIG. 2, the housing 100 includes an inner housing 110, and an outer housing 120 that accommodates the inner housing 110 therein.

As illustrated in FIG. 1 and FIG. 2, the inner housing 110 includes a terminal housing part 111 and a hood part 112. The terminal housing part 111 is formed in a substantially cylindrical shape along the axial direction X, and can accommodate and hold the electrical connection part T1 of the terminal T therein. Moreover, the hood part 112 includes a flange portion 112a that protrudes from the outer surface side of the terminal housing part 111, and a cylindrical portion 112b formed in a substantially cylindrical shape along the axial direction X from the end part of the flange portion 112a. Hence, the hood part 112 can accommodate and hold the terminal housing part 111 therein. In the connector 1 of the present embodiment, there are two terminal housing parts 111 along the width direction Y with an interval therebetween. The electrical connection part T1 of the terminal T is housed in each of the terminal housing parts 111.

As illustrated in FIG. 1 and FIG. 2, the outer housing 120 includes an outer housing main body part 121 and a flange part 122. The outer housing main body part 121 is formed in a substantially cylindrical shape along the axial direction X, and can accommodate and hold the inner housing 110 therein. Moreover, the flange part 122 protrudes from the outer surface side of the outer housing main body part 121, and a hole 112h that penetrates through the flange part 122 along the axial direction X is provided on the flange part 122. Therefore, the housing 100 of the present embodiment is fixed to a vehicle body, when a fastening member such as a screw is inserted into the hole formed on the flange part 122 of the outer housing 120. Moreover, by accommodating the housing or the like of the counterpart connector in the hood part 112 of the inner housing 110, when the connector 1 is fitted to the counterpart connector, the housing 100 can removably hold the counterpart connector.

The terminal holder 200 is formed of an insulating synthetic resin material, and accommodates the electric wire connection part T2 of the terminal T therein. As illustrated in FIG. 2, the terminal holder 200 includes a terminal holder main body part 210 and a connection part 220. The terminal holder main body part 210 is formed in a substantially cylindrical shape along the axial direction X. The terminal holder main body part 210 is assembled to the end part of the terminal housing part 111 on the base end side in the axial direction X, to accommodate the electric wire connection part T2 and a part of the electric wire W extending from the electric wire connection part T2 therein. Moreover, the connection part 220 is formed on the outer surface side of the terminal holder main body part 210. The connection part 220 is formed along the axial direction X to accommodate the base end side of the housing 100 therein. In the connector 1 of the present embodiment, there are two terminal holder main body parts 210. The electric wire connection part T2 and a part of the electric wire W extending from the electric wire connection part T2 are housed in each of the terminal holder main body parts 210. Moreover, the terminal holder main body part 210 includes a tip end side portion 211 disposed on the tip end side in the axial direction X, a base end side portion 212 disposed on the base end side in the axial direction X, and a reduced diameter portion 213 disposed between the tip end side portion 211 and the base end side portion 212. Moreover, the base end side portion 212 is partially and integrally formed on the terminal holder main body parts 210. Furthermore, each of the terminal holder main body parts 210 is assembled while the tip end side portion 211 of the terminal holder main body part 210 is housed inside the terminal housing part 111. Hence, the terminal holder main body part 210 holds the terminal T by housing the terminal T between the terminal housing part 111 and the terminal holder main body part 210. Still furthermore, the connection part 220 is connected via a fastening member such as a screw, while the inner housing 110 is sandwiched between the outer housing 120 and the connection part 220.

The rear holder 300 holds a rubber stopper 430 that is the water sealing member 400 between the terminal holder 200 and the rear holder 300. As illustrated in FIG. 1 and FIG. 2, the rear holder 300 includes a rear holder main body part 310 and a part 320 to be locked. The rear holder main body part 310 has a hole 310h that is formed along the axial direction X and that penetrates through the rear holder main body part 310. While the electric wire W is inserted into the hole 310h, the rear holder main body part 310 is assembled to the end part of the terminal holder 200 on the base end side in the axial direction X, to hold the electric wire W. Moreover, by being locked to a locking part formed on the terminal holder 200, the part 320 to be locked can fix the rear holder 300 to the housing 100. The rear holder main body part 310 of the present embodiment has two holes 310h, and the electric wire W is inserted into each of the holes 310h. Therefore, the rear holder 300 can hold the two electric wires W. Moreover, the rear holder main body part 310 is provided with a piece to be locked that protrudes from the outer surface side. A hole is provided on the piece to be locked as a portion to be engaged with a projection part formed on the locking part.

The water sealing member 400 is formed of elastic synthetic rubber, and prevents liquid such as water from infiltrating into the terminal housing part 111. As illustrated in FIG. 2, the water sealing member 400 includes an inner packing 410, a terminal packing 420, and the rubber stopper 430. The inner packing 410 is assembled to the terminal housing part 111 on the base end side in the axial direction X to prevent liquid from infiltrating into the terminal holder 200. Hence the inner packing 410 can prevent liquid from infiltrating through a gap between the outer surface of the tip end side portion 211 of the terminal holder main body part 210 and the inner surface of the terminal housing part 111. Moreover, by being attached between the electrical connection part T1 and the electric wire connection part T2 of the terminal T, the terminal packing 420 is assembled to the tip end side portion 211 of the terminal holder main body part 210. Hence, the terminal packing 420 can prevent liquid from infiltrating through a gap between the outer surface of the terminal T inserted via the through hole of the terminal packing 420 and the inner surface of the terminal holder main body part 210. Furthermore, while being attached to the electric wire W, the rubber stopper 430 is assembled to the base end side portion 212 of the terminal holder main body part 210. Hence, the rubber stopper 430 can prevent liquid from infiltrating through a gap between the outer surface of the electric wire W inserted via the through hole of the rubber stopper 430 and the inner surface of the terminal holder main body part 210.

Figure 4:
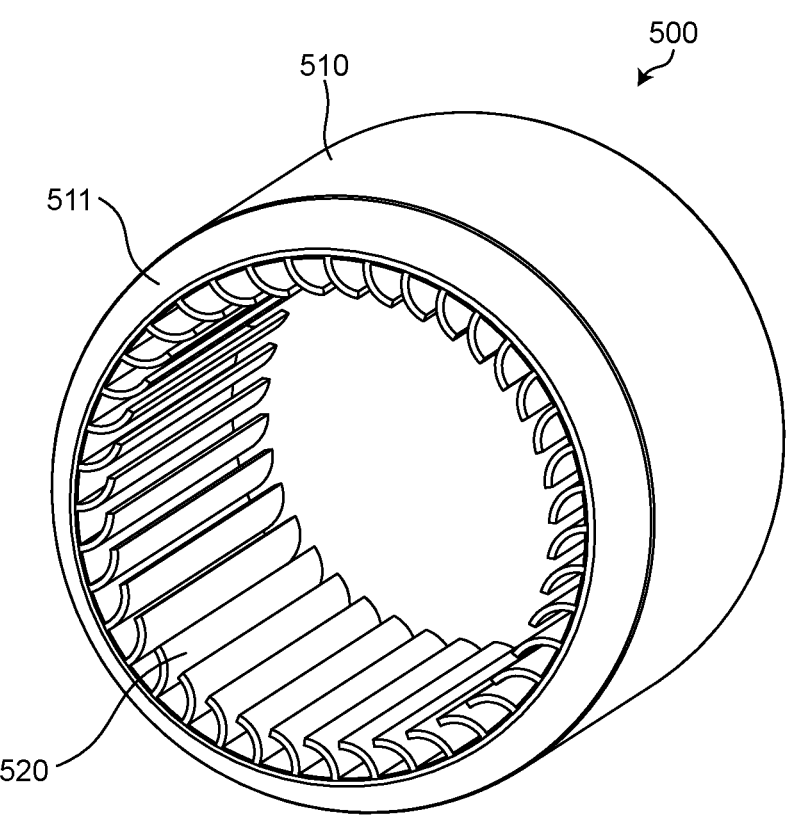
FIG. 4 is a perspective view illustrating a schematic configuration of a heat storage member according to the embodiment.
Figure 4:
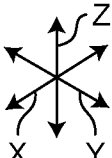

The heat storage member 500 is a member formed of a metal material, and absorbs and accumulates heat generated from the terminal T serving as a heat generation source. When the rubber stopper 430 is assembled to the base end side portion 212 of the terminal holder main body part 210, the heat storage member 500 is disposed in an air layer (watertight region S) formed between the electric wire connection part T2 of the terminal T and the terminal holder 200, and is disposed while the heat storage member 500 is brought into contact with the electric wire connection part T2 of the terminal T serving as one of the heat generation sources (see FIG. 2). As illustrated in FIG. 2 to FIG. 4, the heat storage member 500 includes a heat storage member main body part 510 and an inner fin 520.

The heat storage member main body part 510 is formed in a substantially cylindrical shape along the axial direction X. The heat storage member main body part 510 is assembled to the electric wire connection part T2 of the terminal T to accommodate the electric wire connection part T2 therein, and is disposed while covering the outer surface of the electric wire connection part T2 (see FIG. 2 and FIG. 3). Moreover, the heat storage member main body part 510 includes an inclined part 511 formed on the end part on the tip end side in the axial direction X. The heat storage member main body part 510 is disposed while the end part of the inclined part 511 on the tip end side in the axial direction X is brought into contact with the inner surface of the reduced diameter portion 213 of the terminal holder 200 (see FIG. 2).

The inner fin 520 is a projecting piece that protrudes from the inner surface side of the heat storage member main body part 510, and formed in a straight line along the axial direction X. For example, the inner fin 520 is a thin plate formed by thinly cutting the inner surface of the heat storage member main body part 510 by skiving. The inner fin 520 of the present embodiment has flexibility, and is elastically deformable in the radial direction. Moreover, a plurality of the inner fins 520 are provided along the peripheral direction of the heat storage member main body part 510 (see FIG. 4). Therefore, because each of the inner fins 520 deforms according to the shape of the outer surface of the electric wire connection part T2 of the terminal T serving as an inner contact target surface C1 (contact target surface located on the inside of the heat storage member 500), the heat storage member 500 can follow the shape (external shape) of the terminal T located inside the heat storage member 500 (see FIG. 3).

Figure 5:
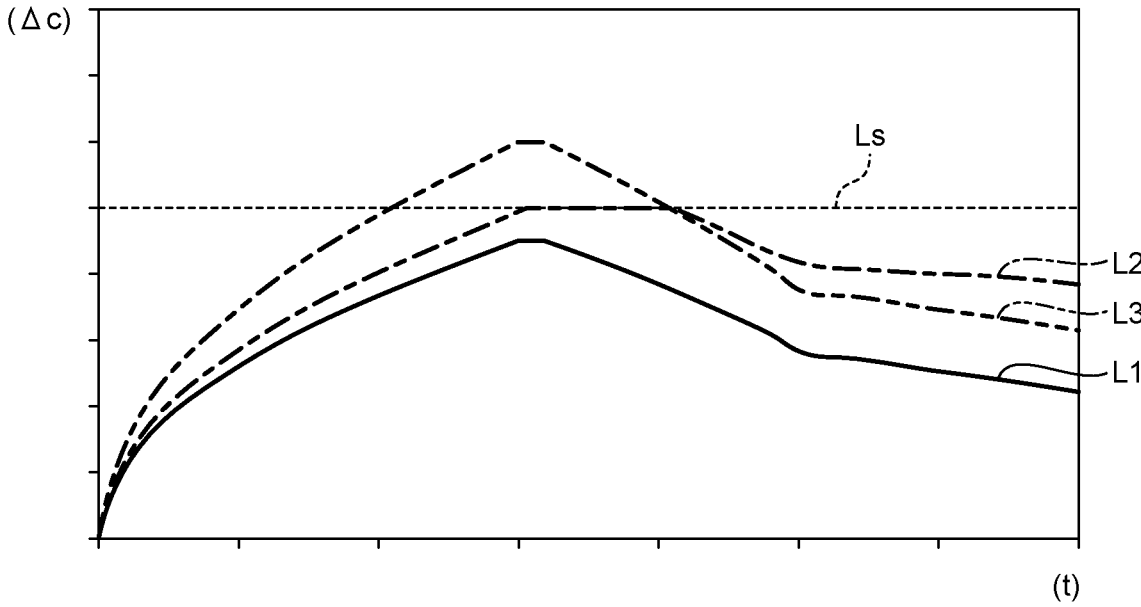
FIG. 5 is a diagram for explaining the temperature rise rate of the connector according to the embodiment.

Next, with reference to FIG. 5, the temperature rise rate Δc of the connector 1 according to the present invention will be described in comparison with the temperature rise rate Δc of the connector according to a comparative example. The connector according to the comparative example is a connector to which the heat storage member 500 is not applied. Moreover, the vertical axis of the line graph illustrated in FIG. 5 indicates the temperature rise rate Δc, and the horizontal axis of the line graph indicates the elapsed time t. Furthermore, in the line graph illustrated in FIG. 5, a change in the temperature rise rate Δc when a normal current is applied to the connector according to the comparative example is illustrated by a line L1, a change in the temperature rise rate Δc when a large current is applied to the connector according to the comparative example is illustrated by a line L2, and a change in the temperature rise rate Δc when a large current is applied to the connector 1 according to the present invention is illustrated by a line L3. Still furthermore, in the line graph illustrated in FIG. 5, the safety standard temperature of the connector 1 is illustrated by a line Ls.

When a large current is applied to the connector to which the heat storage member 500 is not applied, the amount of heat generated from a place with high resistance such as the electrical connection part T1 and the electric wire connection part T2 of the terminal T is increased, and the heat is accumulated in the terminal T serving as a heat generation source. Therefore, with the connector according to the comparative example, when the magnitude of the flowing current is increased, the temperature rise rate Δc is increased (temperature rise speed is increased). Due to a rapid temperature (internal temperature) increase, the temperature rise rate Δc (line L2) may temporarily exceed the safety standard temperature (line Ls).

In contrast, when a large current is applied to the connector 1 to which the heat storage member 500 is applied, the heat generated from the heat generation source is absorbed (dissipated) from the end part of the inner fin 520 of the heat storage member 500 that is disposed while being brought into point contact with the outer surface of the electric wire connection part T2 of the terminal T. Hence, the heat is transferred to the whole inner fin 520. Then, the heat is transferred to the heat storage member main body part 510 from each of the inner fins 520, and the heat is accumulated in the whole heat storage member main body part 510. Therefore, the connector 1 according to the present invention prevents heat from accumulating in the heat generation source, and prevents a rapid internal temperature increase caused when heat is instantaneously built up in a local area. Thus, the connector 1 can prevent the temperature rise rate Δc (line L3) from exceeding the safety standard temperature (line Ls), and can respond to a large current by satisfying the temperature requirements as a connector.

In addition, the heat accumulated in the whole heat storage member main body part 510 is transferred to the terminal holder 200 from the inclined part 511 formed in the heat storage member main body part 510. Hence the heat is transferred to a member disposed outside the terminal T and that is located adjacent to the heat storage member 500. Therefore, because the heat is dispersed to each member, the heat is less likely instantaneously built up in the air layer (watertight region S) located in the vicinity of the terminal T, and the temperature of the heat storage member 500 is less likely to be saturated. Hence, the connector 1 can more reliably prevent a rapid internal temperature increase. Thus, the connector 1 can more reliably prevent the temperature rise rate Δc (line L3) from exceeding the safety standard temperature (line Ls), and can respond to a large current by satisfying the temperature requirements as a connector.

The connector 1 described above includes the terminal T including the electric wire connection part T2 electrically connected to the conductive electric wire W and the electrical connection part T1 that can be electrically connected to a connection counterpart member; the housing 100 that accommodates and holds the terminal T therein; and the heat storage member 500 that is formed in a cylindrical shape by a conductive metal material, that accommodates the electric wire connection part T2 therein, and that covers the outer surface of the electric wire connection part T2. The heat storage member 500 includes the inner fins 520 that protrude from the inner surface side and that are disposed while being brought into contact with the outer surface (inner contact target surface C1) of the electric wire connection part T2.

According to such a configuration, the connector 1 can transfer and accumulate the heat generated from the terminal T serving as a heat generation source, to the heat storage member 500 located adjacent to the terminal T, when the inner fin 520 of the heat storage member 500 absorbs the heat from the outer surface of the electric wire connection part T2 of the terminal T. Therefore, the connector 1 can prevent heat from accumulating in the heat generation source, and prevent a rapid internal temperature increase caused when heat is instantaneously built up in a local area. Thus, the connector 1 can respond to a large current by satisfying the temperature requirements as a connector, and can prevent an increase in size, caused when the diameter of the electric wire W is increased to prevent a rapid temperature increase, or when a cooling device is additionally provided.

Moreover, the connector 1 described above includes the terminal holder 200 that is assembled to the end part of the housing 100 and that accommodates the electric wire connection part T2 therein, and the water sealing member 400 that is assembled to the terminal holder 200 and that stops water between the outer surface of the electric wire W and the inner surface of the terminal holder 200. Furthermore, the heat storage member 500 is disposed in the watertight region S formed between the electric wire connection part T2 and the terminal holder 200. According to such a configuration, the heat transfer properties of the heat storage member 500 are higher than those of the air layer, and the heat storage member 500 can more effectively absorb and accumulate the heat generated from the heat generation source from the outer surface of the electric wire connection part T2. Moreover, the heat storage member 500 can also prevent heat from instantaneously building up in the air layer located in the vicinity of the terminal T and located in the space (watertight region S) sealed by the water sealing member 400. Hence, the heat storage member 500 can more reliably prevent a rapid internal temperature increase in the connector 1. Thus, the connector 1 can respond to a large current by satisfying the temperature requirements as a connector, and the connector 1 can more reliably prevent an increase in size, caused when the diameter of the electric wire W is increased to prevent a rapid temperature increase, or when a cooling device is additionally provided. Moreover, by disposing the heat storage member 500 in the watertight region S, it is possible to prevent liquid such as water from entering and being retained between the terminal T and the heat storage member 500. Thus, for example, the connector 1 can prevent the occurrence of rusting or galvanic corrosion caused by the contact of different types of metal, between the terminal T and the heat storage member 500.

Furthermore, in the heat storage member 500 of the connector 1 described above, the inner fin 520 is elastically deformable, and deforms according to the shape of the outer surface (inner contact target surface C1) of the electric wire connection part T2. According to such a configuration, because each of the inner fins 520 deforms according to the shape of the outer surface of the electric wire connection part T2, the heat storage member 500 can follow the shape (external shape) of the terminal T located inside the heat storage member 500. The heat storage member 500 is disposed while each of the inner fins 520 is more reliably brought into contact with the outer surface of the electric wire connection part T2. Therefore, the heat storage member 500 can more effectively absorb and accumulate the heat from the outer surface of the electric wire connection part T2 via the inner fin 520. Thus, by more reliably preventing heat from accumulating in the terminal T and preventing heat from instantaneously building up in a local area, the connector 1 can more reliably prevent a rapid internal temperature increase in the connector 1. Moreover, because each of the inner fins 520 deforms according to the shape of the outer surface of the electric wire connection part T2, it is possible to easily assemble the heat storage member 500 to each member. Thus, the connector 1 can improve workability during assembly.

Modification

Next, a modification of the embodiment will be described. As illustrated in FIG. 4, the heat storage member 500 includes the heat storage member main body part 510 and the inner fin 520 that protrudes from the inner surface side of the heat storage member main body part 510. However, the embodiment is not limited thereto.

Figure 6:
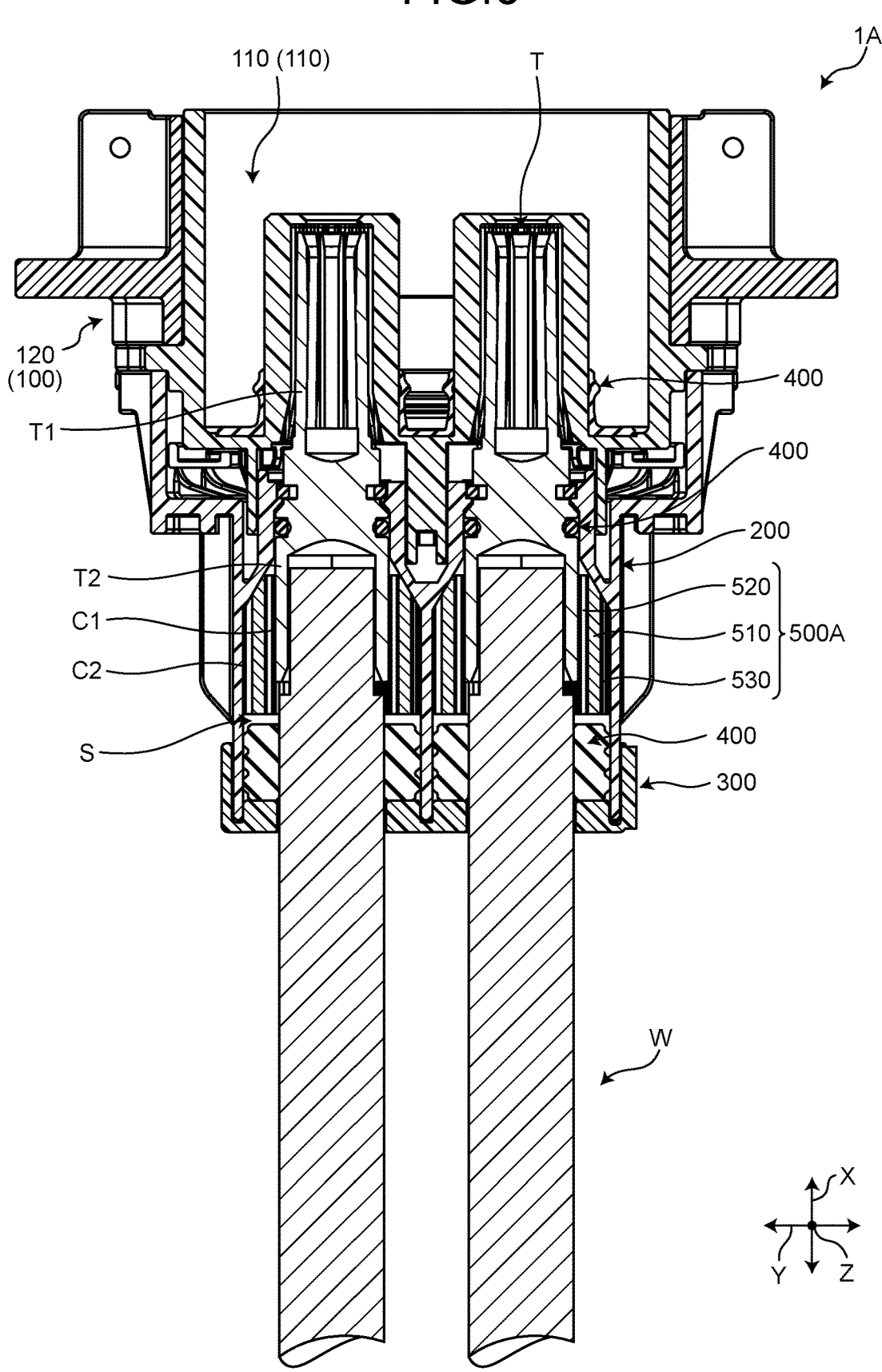
FIG. 6 is a sectional view illustrating a schematic configuration of a connector according to a modification.
Figure 7:
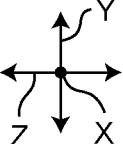
FIG. 7 is a sectional view illustrating a schematic configuration of the connector according to the modification.
Figure 8:
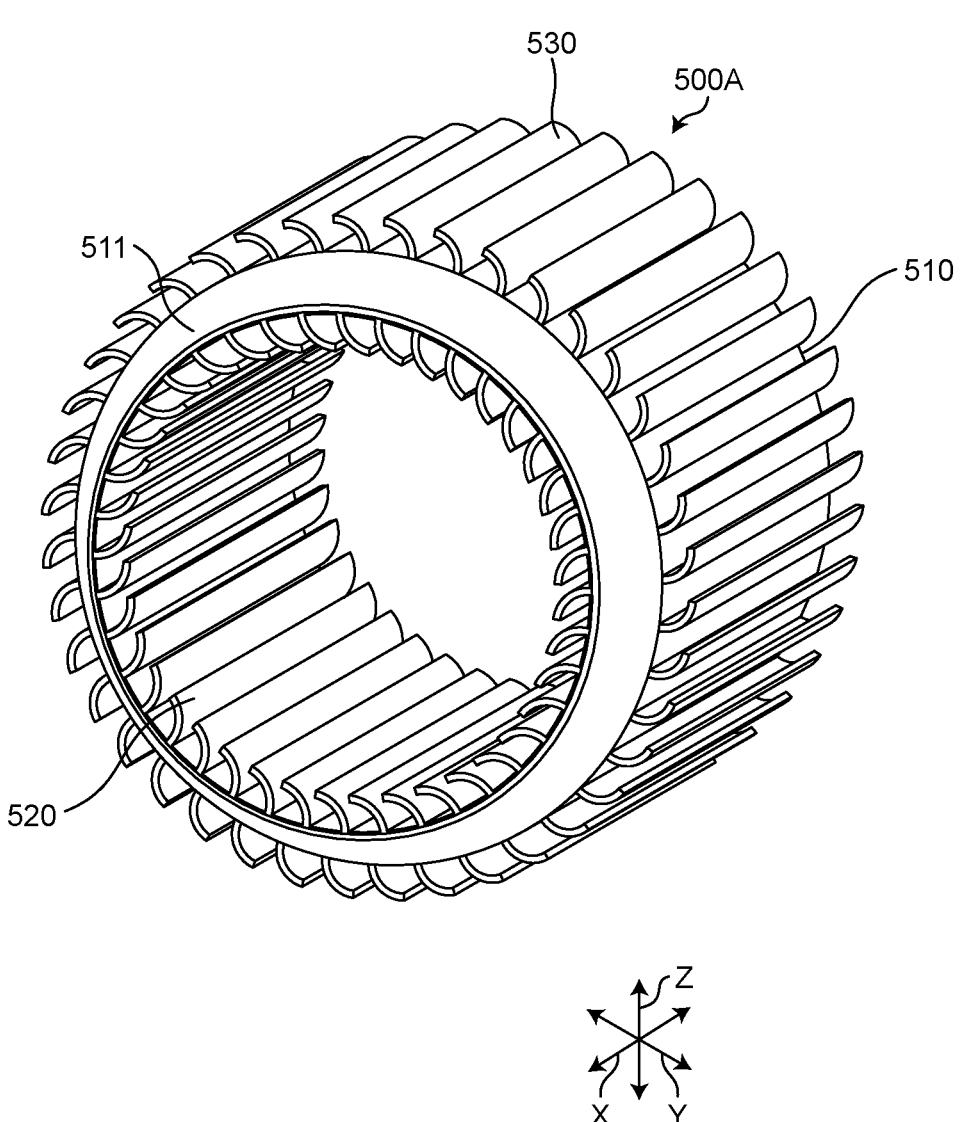
FIG. 8 is a perspective view illustrating a schematic configuration of a heat storage member according to the modification.

For example, as illustrated in FIG. 6 to FIG. 8, a heat storage member 500A of a connector 1A according to a modification also includes an outer fin 530, in addition to the heat storage member main body part 510 on which the inclined part 511 is formed, and the inner fin 520 that protrudes from the inner surface side of the heat storage member main body part 510.

The outer fin 530 is a projecting piece that protrudes from the outer surface side of the heat storage member main body part 510, and formed in a straight line along the axial direction X. For example, the outer fin 530 is a thin plate formed by thinly cutting the inner surface of the heat storage member main body part 510 by skiving. Similar to the inner fin 520, the outer fin 530 of the present embodiment has flexibility, and is elastically deformable in the radial direction. Moreover, a plurality of the outer fins 530 are provided along the peripheral direction of the heat storage member main body part 510 (see FIG. 8). Therefore, because each of the outer fins 530 deforms according to the shape of the inner surface of the base end side portion 212 of the terminal holder 200 serving as an outer contact target surface C2 (contact target surface located on the outside of the heat storage member 500A), the heat storage member 500A can follow the shape (inner shape) of a member located outside the heat storage member 500A (see FIG. 6 and FIG. 7). According to such a configuration, the heat storage member 500A is disposed while each of the outer fins 530 is more reliably brought into contact with the inner surface of the terminal holder 200. Therefore, the heat storage member 500A can absorb heat from the outer surface of the electric wire connection part T2 via the inner fin 520. Also, by transferring heat to a member located adjacent to the heat storage member 500A via the outer fin 530, the heat storage member 500A can disperse the heat. Thus, by more reliably preventing heat from accumulating in the terminal T, the connector 1A can prevent a rapid internal temperature increase in the connector 1A, caused when heat is instantaneously built up in the air layer located in the vicinity of the terminal T, or when the temperature of the heat storage member 500A is saturated. Thus, the connector 1A can respond to a large current by satisfying the temperature requirements as a connector, and can prevent an increase in size, caused when the diameter of the electric wire W is increased to prevent a rapid temperature increase, or when a cooling device is additionally provided. Moreover, because each of the outer fins 530 deforms according to the shape of the outer contact target surface C2, it is possible to easily assemble the heat storage member 500 to each member. Thus, the connector 1A can improve workability during assembly.

The connectors 1 and 1A according to the embodiment of the present invention described above are not limited to those in the embodiment described above, and various changes can be made within the scope of the claims.

For example, the heat storage members 500 and 500A may not be disposed in the watertight region formed between the electric wire connection part T2 of the terminal T and the terminal holder 200.

Moreover, the inner fin 520 and the outer fin 530 may not be elastically deformable, or may not deform according to the shape of the inner contact target surface C1 or the outer contact target surface C2.

Furthermore, the shape, number, or the like of the inner fin 520 and the outer fin 530 are not specifically limited.

Still furthermore, the member located on the outside of the heat storage members 500 and 500A is the terminal holder 200. However, the embodiment is not limited thereto.

Still furthermore, the connectors 1 and 1A are connectors used for connecting mechanism for wire-to-wire connections. However, the embodiment is not limited thereto. For example, the connectors 1 and 1A may also be connectors used for connecting mechanisms for wire-to-electrical device connections.

Still furthermore, the connectors 1 and 1A according to the present embodiment may also be configured by suitably combining the components of the embodiment described above.

The connector according to the present embodiment has effects in preventing an increase in size while satisfying the temperature requirements.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector, comprising:
a terminal that includes an electric wire connection part electrically connected to a conductive electric wire and an electrical connection part that is able to be electrically connected to a connection counterpart member;
a housing that accommodates and holds the terminal therein; and
a heat storage member that is formed in a cylindrical shape by a conductive metal material, that accommodates the electric wire connection part therein, and that covers an outer surface of the electric wire connection part, wherein
the heat storage member includes a plurality of inner fins that protrude from an inner surface side and that are disposed while being brought into contact with the outer surface of the electric wire connection part.

2. The connector according to claim 1, further comprising:
a terminal holder that is assembled to an end part of the housing and that accommodates the electric wire connection part therein, and
a water sealing member that is assembled to the terminal holder and that stops water between an outer surface of the electric wire and an inner surface of the terminal holder, wherein
the heat storage member is disposed in a watertight region formed between the electric wire connection part and the terminal holder.

3. The connector according to claim 1, wherein
the heat storage member includes a plurality of outer fins that protrude from an outer surface side, and that are disposed while being brought into contact with an inner surface of a member located outside the heat storage member.

4. The connector according to claim 2, wherein
the heat storage member includes a plurality of outer fins that protrude from an outer surface side, and that are disposed while being brought into contact with an inner surface of a member located outside the heat storage member.

5. The connector according to claim 1, wherein
the inner fins are elastically deformable, and deform according to a shape of the outer surface of the electric wire connection part that is brought into contact with the inner fins.

6. The connector according to claim 2, wherein
the inner fins are elastically deformable, and deform according to a shape of the outer surface of the electric wire connection part that is brought into contact with the inner fins.

7. The connector according to claim 3, wherein
the outer fins are elastically deformable, and deform according to a shape of the inner surface of the member that is brought into contact with the outer fins.

8. The connector according to claim 4, wherein
the outer fins are elastically deformable, and deform according to a shape of the inner surface of the member that is brought into contact with the outer fins.

* * * * *